US008088549B2

(12) United States Patent
Levanon et al.

(10) Patent No.: US 8,088,549 B2
(45) Date of Patent: Jan. 3, 2012

(54) RADIATION-SENSITIVE ELEMENTS WITH DEVELOPABILITY-ENHANCING COMPOUNDS

(75) Inventors: Moshe Levanon, Ness-Ziona (IL); Moshe Nakash, Ramat Hashron (IL)

(73) Assignee: Eastman Kodak Company, Rochester, NY (US)

( * ) Notice: Subject to any disclaimer, the term of this patent is extended or adjusted under 35 U.S.C. 154(b) by 596 days.

(21) Appl. No.: 11/959,492

(22) Filed: Dec. 19, 2007

(65) Prior Publication Data

US 2009/0162783 A1 Jun. 25, 2009

(51) Int. Cl.
*G03F 7/004* (2006.01)

(52) U.S. Cl. ...................... 430/270.1; 430/302; 430/919

(58) Field of Classification Search ............... 430/270.1, 430/278.1, 302, 326, 944, 300, 919
See application file for complete search history.

(56) References Cited

U.S. PATENT DOCUMENTS

| | | | | |
|---|---|---|---|---|
| 5,238,771 | A * | 8/1993 | Goto et al. | 430/165 |
| 5,380,618 | A * | 1/1995 | Kokubo et al. | 430/190 |
| 6,174,646 | B1 * | 1/2001 | Hirai et al. | 430/302 |
| 6,255,033 | B1 | 7/2001 | Levanon et al. | |
| 6,541,181 | B1 | 4/2003 | Levanon et al. | |
| 7,175,969 | B1 | 2/2007 | Ray et al. | |
| 2004/0091811 | A1 | 5/2004 | Munnelly et al. | |
| 2005/0175931 | A1 * | 8/2005 | Barr et al. | 430/270.1 |
| 2005/0214675 | A1 | 9/2005 | Watanabe et al. | |
| 2005/0214677 | A1 | 9/2005 | Nagashima | |

FOREIGN PATENT DOCUMENTS

| | | |
|---|---|---|
| GB | 1 335 517 | 10/1973 |
| WO | 2004/018662 | 9/2004 |

OTHER PUBLICATIONS

U.S. Appl. No. 11/677,599, filed Feb. 22, 2007, titled Radiation-Sensitive Compositions and Elements With Basic Development Enhancers, by Moshe Levanon et al.

U.S. Appl. No. 11/769,766 , filed Jun. 28, 2007, titled Radiation-Sensitive Compositions and Elements With Solvent Resistant Poly(Vinyl Acetal)s, by Moshe Levanon et al.

* cited by examiner

*Primary Examiner* — Anca Eoff
(74) *Attorney, Agent, or Firm* — J. Lanny Tucker

(57) ABSTRACT

Positive-working imageable elements can be imaged and developed to prepare imaged elements such as lithographic printing plates. The imageable elements including an imageable layer that has one or more alkaline soluble polymeric binders and a developability-enhancing compound that is represented by Structure (DEC) or ($DEC_1$) described herein that are organic compounds having at least one amino group and at least one carboxylic acid group in each molecule.

14 Claims, No Drawings

RADIATION-SENSITIVE ELEMENTS WITH DEVELOPABILITY-ENHANCING COMPOUNDS

FIELD OF THE INVENTION

This invention relates to positive-working imageable elements containing unique developability-enhancing compounds. It also relates to methods of imaging these elements to provide imaged elements that can be used as lithographic printing plates.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, the ink receptive regions accept the ink and repel the water. The ink is then transferred to the surface of suitable materials upon which the image is to be reproduced. In some instances, the ink can be first transferred to an intermediate blanket that in turn is used to transfer the ink to the surface of the materials upon which the image is to be reproduced.

Imageable elements useful to prepare lithographic (or offset) printing plates typically comprise one or more imageable layers applied over a hydrophilic surface of a substrate (or intermediate layers). The imageable layer(s) can comprise one or more radiation-sensitive components dispersed within a suitable binder. Following imaging, either the exposed regions or the non-exposed regions of the imageable layer(s) are removed by a suitable developer, revealing the underlying hydrophilic surface of the substrate. If the exposed regions are removed, the element is considered as positive-working. Conversely, if the non-exposed regions are removed, the element is considered as negative-working. In each instance, the regions of the imageable layer(s) that remain are ink-receptive, and the regions of the hydrophilic surface revealed by the developing process accept water or aqueous solutions (typically a fountain solution), and repel ink.

Similarly, positive-working compositions can be used to form resist patterns in printed circuit board (PCB) production, thick-and-thin film circuits, resistors, capacitors, and inductors, multichip devices, integrated circuits, and active semiconductive devices.

"Laser direct imaging" methods (LDI) have been known that directly form an offset printing plate or printing circuit board using digital data from a computer, and provide numerous advantages over the previous processes using masking photographic films. There has been considerable development in this field from more efficient lasers, improved imageable compositions and components thereof.

Thermally sensitive imageable elements can be classified as those that undergo chemical transformation(s) in response to, exposure to, or adsorption of, suitable amounts of thermal energy. The nature of thermally induced chemical transformation may be to ablate the imageable composition in the element, or to change its solubility in a particular developer, or to change the tackiness or hydrophilicity or hydrophobicity of the surface layer of the thermally sensitive layer. As such, thermal imaging can be used to expose predetermined regions of an imageable layer that can serve as a lithographic printing surface or resist pattern in PCB production.

Positive-working imageable compositions containing novolak or other phenolic polymeric binders and diazoquinone imaging components have been prevalent in the lithographic printing plate and photoresist industries for many years. Imageable compositions based on various phenolic resins and infrared radiation absorbing compounds are also well known.

A wide range of thermally-imageable compositions useful as thermographic recording materials are described in GB Patent Publication 1,245,924 (Brinckman). This publication describes increasing the solubility of any given area of the imageable layer in a given solvent by heating the imageable layer by indirect exposure to a short-duration, high intensity visible light or infrared radiation. This radiation can be transmitted or reflected from the background areas of a graphic original located in contact with the recording material. The publication describes various mechanisms and developing materials and novolak resins are included among the aqueous developable compositions that can also include radiation absorbing compounds such as carbon black or C.I. Pigment Blue 27.

WO 2004/081662 (Memetea et al.) describes the use of various developability-enhancing compounds of acidic nature with phenolic polymers or poly(vinyl acetals) to enhance the sensitivity of positive-working compositions and elements so that required imaging energy is reduced. Some of the particularly useful poly(vinyl acetals) for such compositions and elements are described in U.S. Pat. No. 6,255,033 (Levanon et al.) and U.S. Pat. No. 6,541,181 (Levanon et al.).

The industry has focused on the need to diminish the solubility of the exposed regions of phenolic binders (dissolution inhibitors) in the imageable layers before exposure and to enhance their solubility after exposure to suitable thermal energy (dissolution enhancers). Several materials capable of increasing the sensitivity of positive-working compositions have been described. Commonly, the described previous dissolution enhancers are of an acidic nature, and include sulfonic acids, sulfinic acids, alkylsulfuric acids, phosphonic acids, phosphinic acids phosphoric acid esters, carboxylic acids, phenols, sulfonamides and sulfonimides.

Thermally imageable elements containing certain basic nitrogen-containing developability-enhancing materials comprising a basic nitrogen-containing organic alcohol compound are used with poly(vinyl acetal)s as described in copending and commonly assigned U.S. Ser. No. 11/677,599 (filed Feb. 22, 2007 by M. Levanon, L. Postel, M. Rubin, and T. Kurtser). Unique poly(vinyl acetal)s that can also be used in positive-working imageable elements are described in copending and commonly assigned U.S. Ser. No. 11/769,766 (filed Jun. 28, 2007 by M. Levanon, E. Lurie, and V. Kampel).

Problem to be Solved

While the compositions described in the art have provided important advances in the art, there is a continuing need to improve the sensitivity of positive-working compositions and elements even more, and particularly in their response to infrared radiation, without loss of other desired properties.

SUMMARY OF THE INVENTION

The present invention provides an advance in the art with novel radiation-sensitive imageable elements. Thus, the present invention provides a positive-working imageable element comprising a substrate, and having thereon:

an imageable layer comprising an aqueous alkaline developer soluble polymeric binder, a developability-enhancing compound, and a radiation absorbing compound, wherein the developability-enhancing compound is an organic compound having at least one amino group and at least one carboxylic acid group In many embodiments, the developability-enhancing compound is represented by the following Structure (DEC):

$$[HO—C(=O)]_m\text{-}A\text{-}[N(R_1)(R_2)]_n \qquad (DEC)$$

wherein:

$R_1$ and $R_2$ are independently hydrogen or substituted or unsubstituted alkyl, substituted or unsubstituted cycloalkyl, or substituted or unsubstituted aryl groups, A is a substituted or unsubstituted organic linking group having at least one carbon, nitrogen, sulfur, or oxygen atom in the chain, wherein A also comprises a substituted or unsubstituted arylene group directly connected to $—[N(R_1)(R_2)]_n$, m is an integer of 1 to 4, and n is an integer of 1 to 4.

In other embodiments, the developability-enhancing compound is represented by the Structure (DEC) noted above, wherein at least one of $R_1$ and $R_2$ is a substituted or unsubstituted aryl group, and the other is hydrogen or a substituted or unsubstituted alkyl, substituted or unsubstituted cycloalkyl, or substituted or unsubstituted aryl group, A is a substituted or unsubstituted organic linking group having at least one carbon, nitrogen, sulfur, or oxygen atom in the chain, wherein A also comprises a substituted or unsubstituted alkylene group directly connected to $—[N(R_1)(R_2)]_n$, m is an integer of 1 to 4, and n is an integer of 1 to 4.

Still other embodiments of this invention include positive-working, infrared radiation-sensitive imageable elements comprising an aluminum-containing substrate, and having thereon:

an outermost single imageable layer comprising an aqueous alkaline developer soluble polymeric binder, a developability-enhancing compound, and an infrared radiation absorbing dye, wherein the developability-enhancing compound is represented by the Structure ($DEC_1$) noted below, $$[HO—C(=O)]_m—B\text{-}A\text{-}[N(R_1)(R_2)]_n \qquad (DEC_1)$$

wherein:

$R_1$ and $R_2$ are independently hydrogen or substituted or unsubstituted alkyl, substituted or unsubstituted cycloalkyl, or substituted or unsubstituted aryl groups, A is an organic linking group having a substituted or unsubstituted phenylene directly attached to $—[N(R_1)(R_2)]_n$, B is a single bond or an organic linking group having at least one carbon, oxygen, sulfur, or nitrogen atom in the chain, m is an integer of 1 or 2, n is an integer of 1 or 2, the polymeric binder comprises a phenolic resin or a poly (vinyl acetal) that comprises at least 40 and up to 80 mol % of recurring units represented by the following Structure (PVAc), based on total recurring units:

(PVAc)

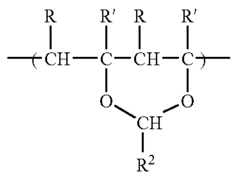

wherein R and R' are independently hydrogen or a substituted or unsubstituted alkyl or halo group, and $R^2$ is a substituted or unsubstituted phenol, naphthol, or anthracenol group.

Further, this invention provides a method of making an image comprising:

A) imagewise exposing the imageable element of this invention to provide exposed and non-exposed regions, and B) developing the imagewise exposed element to remove predominantly only the exposed regions to provide an image in the imaged and developed element.

The positive-working imageable elements of this invention exhibit improved sensitivity to imaging radiation. In addition, it was found that the imageable elements of this invention provide improved mechanical strength and extremely good press performance without baking after development as well as desired resistance to press chemicals. These qualities are not dependent upon the particular substrate used in the element or the type of treatment of aluminum-containing substrates used to prepare lithographic printing plates.

These advantages have been achieved by using a developability-enhancing compound defined by the Structure (DEC) or ($DEC_1$) noted above. As one can see from Structures (DEC) and ($DEC_1$), these compounds have both acidic and basic moieties in the same molecule. This is contrast to known developability-enhancing compounds that have only an acidic or a basic moiety in the molecule. These compounds are used to advantage particularly in admixture with phenolic or poly(vinyl acetal) polymer binders.

DETAILED DESCRIPTION OF THE INVENTION

Definitions

Unless the context otherwise indicates, when used herein, the term "imageable element" are meant to be a reference to embodiments of the present invention. Moreover, the term "radiation-sensitive composition" is meant to refer to a composition of formulation useful in the present invention.

In addition, unless the context indicates otherwise, the various components described herein such as "primary polymeric binder", "phenolic resin", "poly(vinyl acetal)", "radiation absorbing compound", and "developability-enhancing compound" also refer to mixtures of such components. Thus, the use of the articles "a", "an", and "the" is not necessarily meant to refer to only a single component.

Unless otherwise indicated, percentages refer to percents by weight that are based either on the total solids of a radiation-sensitive composition or formulation, or the dry coating weight of a layer.

The term "single-layer imageable element" refers to an imageable element having only one layer for imaging, but as pointed out in more detail below, such elements may also include one or more layers under or over (such as a topcoat) the imageable layer to provide various properties.

As used herein, the term "radiation absorbing compound" refers to compounds that are sensitive to certain wavelengths of radiation and can convert photons into heat within the layer in which they are disposed. These compounds may also be known as "photothermal conversion materials", "sensitizers", or "light to heat converters".

For clarification of definition of any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any different definitions set forth herein should be regarded as controlling.

The term "polymer" (for example, phenolic resin and polyvinyl acetal) refers to high and low molecular weight polymers including oligomers and includes both homopolymers and copolymers.

The term "copolymer" refers to polymers that are derived from two or more different monomers, or have two or more different recurring units, even if derived from the same monomer.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction of some other means.

Uses

The radiation-sensitive compositions described herein can be used to form resist patterns in printed circuit board (PCB) production, thick-and-thin film circuits, resistors, capacitors, and inductors, multi-chip devices, integrated circuits, and active semi-conductive devices. In addition, they can be used to provide positive-working imageable elements that in turn can be used to provide lithographic printing plates having substrates with hydrophilic surfaces. Other imageable elements would be readily apparent to one skilled in the art.

Radiation-Sensitive Compositions

The radiation-sensitive compositions useful to provide imageable elements include one or more aqueous alkaline solvent (developer) soluble polymeric binders as the primary polymeric binders. These primary polymeric binders include various phenolic resins and poly(vinyl acetals). The weight average molecular weight (Mw) of the polymers useful as primary binders is generally at least 5,000 and can be up to 150,000, and typically it is from about 20,000 to about 60,000, as measured using standard procedures. The optimal Mw may vary with the specific class of polymer and its use.

The primary polymeric binders may be the only binders in the radiation-sensitive composition (or imageable layer) but more generally, they comprise at least 10 weight %, and more typically at least 50 weight % and up to 90 weight %, based on the dry weight of all polymeric binders. In some embodiments, the amount of primary polymeric binders may be from about 55 to about 80 weight %, based on the dry weight of all polymeric binders.

Some useful poly(vinyl acetals) are described for example, in U.S. Pat. Nos. 6,255,033 and 6,541,181, and WO 2004/081662, all noted above and incorporated herein by reference. The same or similar poly(vinyl acetals) are described by Structures (I) and (II) containing structural units (a) through (e) in EP 1,627,732 (Hatanaka et al.) and in U.S. Published Patent Applications 2005/0214677 (Nagashima) and 2005/0214678 (Nagashima), all incorporated herein by reference with respect to the poly(vinyl acetals) described therein.

Structures (I) and (II) in EP 1,627,732 (noted above) are not to be confused with Structures (I) and (II) defined below. Some useful poly(vinyl acetals) comprise recurring units other than acetal-containing recurring units as long as least 50 mol % (from about 50 mol % to about 75 mol %, and more typically at least 60 mol %) of the recurring units are acetal-containing recurring units. In such polymeric binders, the non-acetal-containing recurring units may also have the same or different pendant phenolic groups, or they may be recurring units having no pendant phenolic groups, or they may comprise both types of recurring units. For example, the poly(vinyl acetal) could also include recurring units comprising an itaconic acid or crotonic acid group. In addition, if there are recurring units comprising pendant phenolic groups, those recurring units can have different pendant phenolic groups [for example, a poly(vinyl acetal) could have acetal-containing recurring units, and two or more different types of recurring units with different pendant phenolic groups]. In still other embodiments, a small molar amount (less than 20 mol %) of the acetal groups in a poly(vinyl acetal) can be reacted with a cyclic anhydride or isocyanate compound, such as toluene sulfonyl isocyanate).

In some embodiments, the radiation-sensitive composition includes a polymeric binder that comprises a phenolic resin (such as a novolak resin) or a poly(vinyl acetal) that has from about 40 to about 80 mol % recurring acetal-containing units. For example, useful polymeric binders include poly(vinyl acetal)s that comprises at least 40 and up to 80 mol % of recurring units represented by the following Structure (PVAc), based on total recurring units:

(PVAc)

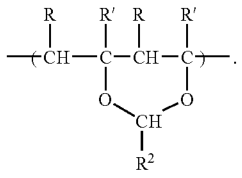

In Structure (PVAc), R and R' are independently hydrogen, or a substituted or unsubstituted linear or branched alkyl group having 1 to 6 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl and iso-hexyl groups), or substituted or unsubstituted cycloalkyl ring having 3 to 6 carbon atoms in the ring (such as cyclopropyl, cyclobutyl, cyclopentyl, methylcyclohexyl, and cyclohexyl groups), or a halo group (such as fluoro, chloro, bromo, or iodo). Typically, R and R' are independently hydrogen, or a substituted or unsubstituted methyl or chloro group, or for example, they are independently hydrogen or unsubstituted methyl. It is to be understood that the R and R' groups for different recurring units in the polymeric binder can be the same or different groups chosen from the noted definition.

$R^2$ is a substituted or unsubstituted phenol, a substituted or unsubstituted naphthol, or a substituted or unsubstituted anthracenol group. These phenol, naphthol and anthracenol groups can have optionally up to 3 additional substituents including additional hydroxy substituents, methoxy, alkoxy, aryloxy, thioaryloxy, halomethyl, trihalomethyl, halo, nitro, azo, thiohydroxy, thioalkoxy, cyano, amino, carboxy, ethenyl, carboxyalkyl, phenyl, alkyl, alkenyl, alkynyl, cycloalkyl, aryl, heteroaryl, and heteroalicyclic groups. For example, $R^2$ can be an unsubstituted phenol or naphthol group such as a 2-hydroxyphenyl or a hydroxynaphthyl group.

In addition, useful poly(vinyl acetals) can be represented by the following Structure (I) comprising the noted recurring units:

$$-(A)_m-(B)_n-(C)_p-(D)_q-(E)_r- \quad (I)$$

wherein:

A represents recurring units represented by the following Structure (Ia):

(Ia)

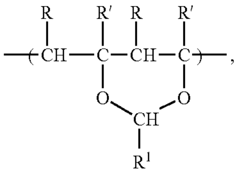

B represents recurring units represented by the following Structure (Ib):

(Ib)

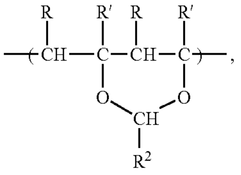

C represents recurring units represented by the following Structure (Ic):

(Ic)

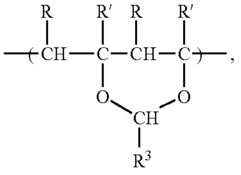

D represents recurring units represented by the following Structure (Id):

(Id)

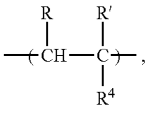

E represents recurring units represented by the following Structure (Ie):

(Ie)

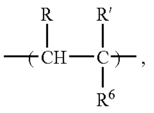

m is from about 5 to about 40 mol % (typically from about 15 to about 35 mol %), n is from about 10 to about 60 mol % (typically from about 20 to about 40 mol %), p can be from 0 to about 20 mol % (typically from 0 to about 10 mol %), q is from about 1 to about 20 mol % (typically from about 1 to about 15 mol %), and r is from about 5 to about 49 mol % (typically from about 15 to about 49 mol %).

R and R' are as described above for Structure (PVAc).

$R^1$ is a substituted or unsubstituted, linear or branched alkyl group having 1 to 12 carbon atoms (such as methyl, ethyl, n-propyl, iso-propyl, t-butyl, n-butyl, n-pentyl, n-hexyl, n-heptyl, n-octyl, n-nonyl, n-decyl, n-undecyl, n-dodecyl, methoxymethyl, chloromethyl, trichloromethyl, benzyl, cinnamoyl, iso-propyl, iso-butyl, s-butyl, t-butyl, iso-pentyl, neo-pentyl, 1-methylbutyl, and iso-hexyl groups), substituted or unsubstituted cycloalkyl ring having 3 to 6 carbon atoms in the ring (such as cyclopropyl, cyclobutyl, cyclopentyl, methylcyclohexyl, and cyclohexyl groups), or a substituted or unsubstituted aryl group having 6 or 10 carbon atoms in the aromatic ring (such as substituted or unsubstituted phenyl and naphthyl groups, including phenyl, xylyl, toluoyl, p-methoxyphenyl, 3-chlorophenyl, and naphthyl) other than a phenol or naphthol. Typically, $R^1$ is a substituted or unsubstituted alkyl group having 1 to 6 carbon atoms such as n-propyl.

$R^2$ is as defined above for Structure (PVAc).

$R^3$ is a substituted or unsubstituted alkynyl group having 2 to 4 carbon atoms (such as ethynyl groups), or a substituted or unsubstituted phenyl group (such as phenyl, 4-carboxyphenyl, carboxyalkyleneoxyphenyl, and carboxyalkylphenyl groups). Typically, $R^3$ is a carboxyalkylphenyl group, 4-carboxyphenyl, or carboxyalkyleneoxyphenyl group, or another carboxy-containing phenyl group.

$R^4$ is an —O—C(═O)—$R^5$ group wherein $R^5$ is a substituted or unsubstituted alkyl group having 1 to 12 carbon atoms or substituted or unsubstituted aryl group having 6 or 10 carbon atoms in the aromatic ring similarly to the definition of $R^1$ provided above. Typically, $R^5$ is a substituted or unsubstituted alkyl group having 1 to 6 carbon atoms such as an unsubstituted methyl group.

$R^6$ is a hydroxy group.

As indicated by the ratios of recurring units in Structure (I), the poly(vinyl acetals) may be at least tetramers depending upon the numbers of different recurring units present. For example, there may be multiple different types of recurring units from any of the defined classes of recurring units, of Structures (Ia) through (Ie). For example, a poly(vinyl acetal) of Structure (I) may have Structure (Ia) recurring units with different $R^1$ groups. Such multiplicity of recurring units can also be true for those represented by any of Structures (Ib) through (Ie).

A primary polymeric binder represented by Structure (I) may contain recurring units other than those defined by Structures (Ia), (Ib), (Ic), (Id), and (Ie), and such recurring units would be readily apparent to a skilled worker in the art. Thus, Structure (I) in its broadest sense is not limited to the defined recurring units, but in some embodiments, only the recurring units in Structure (I) are present.

Content of the primary polymeric binder in the radiation-sensitive composition that forms a radiation-sensitive layer is generally from about 10 to about 99% of the total dry weight, and typically from about 30 to about 95% of the total dry weight. Many embodiments would include the primary polymeric binder in an amount of from about 50 to about 90% of the total composition or layer dry weight.

The poly(vinyl acetals) described herein can be prepared using known starting materials and reaction conditions including those described in U.S. Pat. No. 6,541,181 (noted above).

For example, acetalization of the polyvinyl alcohols takes place according to known standard methods for example as described in U.S. Pat. No. 4,665,124 (Dhillon et al.), U.S. Pat. No. 4,940,646 (Pawlowski), U.S. Pat. No. 5,169,898 (Walls et al.), U.S. Pat. No. 5,700,619 (Dwars et al.), and U.S. Pat. No. 5,792,823 (Kim et al.), and in Japanese Kokai 09-328,519 (Yoshinaga).

This acetalization reaction generally requires addition of a strong inorganic or organic catalyst acid. Examples of catalyst acids are hydrochloric acid, sulfuric acid, phosphoric acid, and p-toluenesulfonic acid. Other strong acids are also useful such as perfluoroalkylsulfonic acid and other perfluoro-activated acids. The amount of acid should effectively allow protonation to occur, but will not significantly alter the final product by causing unwanted hydrolysis of the acetal groups. The reaction temperature of the acetalization depends on the kind of aldehyde as well as the desired level of substitution. It is between 0° C. and, if applicable, the boiling point of the solvent. Organic solvents as well as mixtures of water with organic solvents are used for the reaction. For example, suitable organic solvents are alcohols (such as methanol, ethanol, propanol, butanol, and glycol ether), cyclic ethers (such as 1,4-dioxane), and dipolar aprotic solvents (such as N,N-dimethylformamide, N-methylpyrrolidone or dimethyl sulfoxide). If acetalization is carried out in organic solvents or mixtures of organic solvents with water, the reaction product often remains in solution even if the starting polyvinyl alcohol was not completely dissolved. Incomplete dissolution of the starting polyvinyl alcohol in organic solvents is a disadvantage that may lead to irreproducible degree of conversion and different products. Water or mixtures of organic solvents with water should be used to achieve complete dissolution of polyvinyl alcohol and reproducible products as a result of acetalization. The sequence of the addition of the various acetalization agents is often of no importance and comparable finished products are obtained from different preparation sequences. To isolate the finished products as a solid, the polymer solution is introduced into a non-solvent under vigorous stirring, filtered off and dried. Water is especially suitable as a non-solvent for the polymers.

Unwanted hydrolysis of the acetal group achieved by acetalization with hydroxyl-substituted aromatic aldehydes takes place much easier than for the acetals built from aliphatic or not substituted aromatic aldehydes or from aldehydes containing carboxylic moieties at the same synthesis conditions. The presence of even a small amount of water in the reaction mixture leads to decreased degree of acetalization and incomplete conversion of the aromatic hydroxy aldehyde used. On the other hand, it was found that in the absence of water, the hydroxy-substituted aromatic aldehydes react with hydroxyl groups of alcohols immediately and with almost 100% conversion. So, the process of acetalization of polyvinyl alcohols by hydroxy-substituted aromatic aldehydes to achieve the desired polyvinyl acetals according can be carried out different from the procedures known in the art. The water can be removed from the reaction mixture during the synthesis by distillation under reduced pressure and replaced with an organic solvent. The remaining water may be removed by addition to the mixture an organic material readily reactive with water and as a result of the reaction producing volatile materials or inert compounds. These materials may be chosen from carbonates, orthoesters of carbonic or carboxylic acids, which easily react with water, silica-containing compounds, such as diethylcarbonate, trimethyl orthoformate, tetraethyl carbonate, and tetraethyl silicate. The addition of these materials to reaction mixture leads to 100% conversion of the used aldehydes.

Thus, the preparation of a useful poly(vinyl acetal) can begin with dissolving of the starting polyvinyl alcohol in DMSO at 80-90° C., then the solution is chilled to 60° C., and the acidic catalyst dissolved in an organic solvent is added. Then the solution of the aliphatic aldehyde in the same solvent is added to the solution, the solution is kept for 30 minutes at 60° C., and a solution of the aromatic aldehyde and/or carboxylic substituted aldehyde, or other aldehyde in the same solvent is added. Anisole is added to the reaction mixture, and the azeothropic mixture of water with the anisole is removed by distillation and is replaced by the organic solvent. At this stage, the conversion of the aromatic hydroxy aldehyde reaches 95-98%. The acid in the reaction mixture is neutralized and the mixture is blended with water to precipitate the polymer that is filtrated, washed with water, and dried. A second way to achieve 100% of conversion of the aromatic hydroxyaldehyde to benzal is to add the water removing organic material (for example, a carbonate or orthoformate) after addition of the aldehydes to the reaction mixture.

Other useful polymeric binders are poly(vinyl acetal)s that comprise recurring units that are represented by the following Structure (I-A):

$$-(A)_m-(B)_n- \quad \text{(I-A)}$$

wherein:

A represents recurring units represented by the following Structure (Ia-A):

(Ia-A)

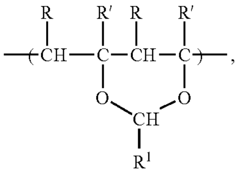

, and

B represents recurring units represented by the following Structure (Ib-A):

(Ib-A)

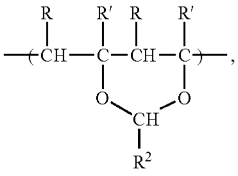

,

In some embodiments, the useful poly(vinyl acetal)s further comprise recurring units that are represented by one or more of the following Structures (Ic-A), (Id-A), (Ie-A), (If-A), and (Ig-A):

(Ic-A)

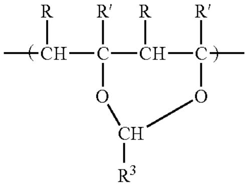

(Id-A)

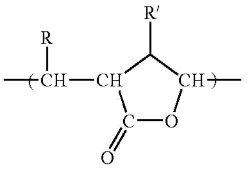

-continued (Ie-A)

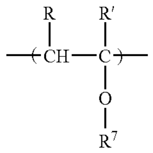

(If-A)

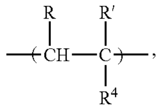

and (Ig-A)

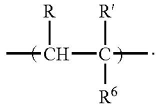

In the above structures, R, R', $R^1$, $R^2$, $R^3$, $R^4$, $R^6$ are as defined above for Structures (I) and (Ia)-(Ie).

$R^7$ is the following group:

($R^7$)

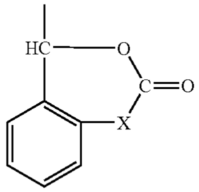

wherein X is a direct single bond or a —O—$CH_2$— group.

It would also be apparent to one skilled in the art that while $R^7$ is illustrated above in an "unopened" form (that is, with a fused ring), it can also exist in the "opened" form wherein there is no heterocyclic ring and there is no bond between the —CH<group and the phenyl ring, and the additional carbon valence is replaced with a hydrogen atom. Thus, the "opened" and "unopened" forms of $R^7$ are considered equivalent for purposes of this invention.

In Structure (I-A), m is at least 20 mol % and typically at least 30 mol % or from about 50 to about 80 mol %, n is at least 10 and typically at least 20 mol %. The sum of m and n (m+n) can be as high as practically possible, but in some embodiments this sum is less than or equal to 75 mol % and typically less than or equal to 60 mol %.

Where the recurring units represented by Structures (Ic-A), (Id-A), (Ie-A), (If-A), and (Ig-A) are present in the polymeric binder, they are present in the following amounts:

from about 2 to about 10 mol % of recurring units represented by Structure (Ic-A), from about 2 to about 25 mol % of recurring units represented by either or both of Structures (Id-A) and (Ie-A), from about 1 to about 15 mol % of recurring units represented by Structure (If-A), and from about 15 to about 30 mol % of recurring units represented by Structure (Ig-A).

In some further embodiments, the alkaline soluble polymeric binder is represented by the following Structure (I-AA):

$$-(A)_m-(B)_n-(C)_p-(D)_q-(E)_r—(F)_s-(G)_t \quad \text{(I-AA)}$$

wherein:

A represents recurring units represented by the following Structure (Ia-A):

(Ia-A)

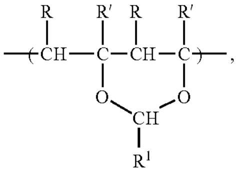

B represents recurring units represented by the following Structure (Ib-A):

(Ib-A)

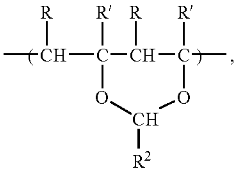

C represents recurring units represented by the following Structure (Ic-A):

(Ic-A)

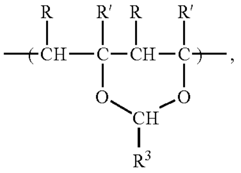

D represents recurring units represented by the following Structure (Id-A):

(Id-A)

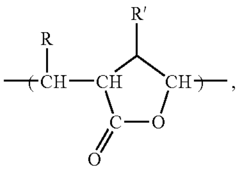

E represents recurring units represented by the following Structure (Ie-A):

(Ie-A)

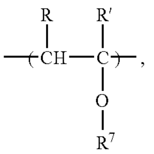

F represents recurring units represented by the following Structure (If-A):

(If-A)

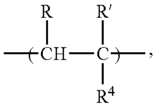

and

G represents recurring units represented by the following Structure (Ig-A):

(Ig-A)

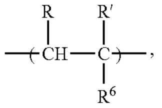

wherein R and R', $R^1$, $R^2$, $R^3$, $R^4$, $R^5$, $R^6$, and $R^7$ are as defined above, m is at least 30 mol %, n is at least 20 mol %, the sum of m and n (m+n) is less than or equal to 60 mol %, p is from about 2 to about 10 mol %, q and r are independently from about 2 to about 25 mol %, s is from about 1 to about 15 mol %, and t is from about 15 to about 30 mol %.

A primary polymeric binder comprising recurring units that are represented by Structure (I-A) or (I-AA) may contain recurring units other than those defined by the noted Structures and such recurring units would be readily apparent to a skilled worker in the art. Thus, Structures (I-A) and (I-AA) in their broadest sense are not limited to the defined recurring units. However, in some embodiments, only the recurring units specifically defined in Structure (I-A) or (I-AA) are present.

There may be multiple types of recurring units from any of the defined classes of recurring units of Structures (Ia-A) through (Ig-A) with different substituents. For example, there may be multiple types of recurring units of Structure (Ia-A) with different $R^1$ groups. Such multiplicity of recurring units can also be true for those represented by any of Structures (Ib-A), (Ic-A), (Id-A), (Ie-A), (If-A), and (Ig-A).

Content of the primary polymeric binder in the radiation-sensitive composition that forms an imageable or radiation-sensitive layer is generally from about 10 to about 99% of the total dry weight, and typically from about 30 to about 95% of the total dry weight. Many embodiments would include the primary polymeric binder in an amount of from about 50 to about 90% of the total composition or layer dry weight.

The poly(vinyl acetals) of Structure (I-A) or (I-AA) described herein can be prepared using known starting materials and reaction conditions including those described for making the polymeric binders defined above in Structures (PVAc) and (I).

All acetal groups are 6-membered cyclic acetal groups. The lactone moiety is derived from the crotonic acid component by dehydration during the distillation stage of the reaction.

Various phenolic resins can also be used as primary polymeric binders in this invention, including novolak resins such as condensation polymers of phenol and formaldehyde, condensation polymers of m-cresol and formaldehyde, condensation polymers of p-cresol and formaldehyde, condensation polymers of m-/p-mixed cresol and formaldehyde, condensation polymers of phenol, cresol (m-, p-, or m-/p-mixture) and formaldehyde, and condensation copolymers of pyrogallol and acetone. Further, copolymers obtained by copolymerizing compound comprising phenol groups in the side chains can be used. Mixtures of such polymeric binders can also be used.

Novolak resins having a weight average molecular weight of at least 1500 and a number average molecular weight of at least 300 are useful. Generally, the weight average molecular weight is in the range of from about 3,000 to about 300,000, the number average molecular weight is from about 500 to about 250,000, and the degree of dispersion (weight average molecular weight/number average molecular weight) is in the range of from about 1.1 to about 10.

Certain mixtures of the primary polymeric binders described above can be used, including mixtures of one or more poly(vinyl acetals) and one or more phenolic resins. For example, mixtures of one or more poly(vinyl acetals) and one or more novolak or resol (or resole) resins (or both novolak and resol resins) can be used.

Other useful resins include polyvinyl compounds having phenolic hydroxyl groups, such as poly(hydroxystyrene)s and copolymers containing recurring units of a hydroxystyrene and polymers and copolymers containing recurring units of substituted hydroxystyrenes.

Also useful are branched poly(hydroxystyrenes) having multiple branched hydroxystyrene recurring units derived from 4-hydroxystyrene as described for example in U.S. Pat. No. 5,554,719 (Sounik) and U.S. Pat. No. 6,551,738 (Ohsawa et al.), and U.S. Published Patent Applications 2003/0050191 (Bhatt et al.) and 2005/0051053 (Wisnudel et al.), and in copending and commonly assigned U.S. patent application Ser. No. 11/474,020 (filed Jun. 23, 2006 by Levanon, J. Ray, K. Ray, Postel, and Korionoff) that is incorporated herein by reference. For example, such branched hydroxystyrene polymers comprise recurring units derived from a hydroxystyrene, such as from 4-hydroxystyrene, which recurring units are further substituted with repeating hydroxystyrene units (such as 4-hydroxystyrene units) positioned ortho to the hydroxy group. These branched polymers can have a weight average molecular weight ($M_w$) of from about 1,000 to about 30,000, preferably from about 1,000 to about 10,000, and more preferably from about 3,000 to about 7,000. In addition, they may have a polydispersity less than 2 and preferably from about 1.5 to about 1.9. The branched poly(hydroxystyrenes) can be homopolymers or copolymers with non-branched hydroxystyrene recurring units.

It may be useful to include a "secondary" polymeric binder with the one or more primary polymeric binders described above. In particular, such secondary polymeric binders may be useful in combination with a poly(vinyl acetal) as described above. The type of the secondary polymeric binder that can be used together with the primary polymeric binder is not particularly restricted. In general, from a viewpoint of not diminishing the positive radiation-sensitivity of the imageable element, the secondary polymeric binder is generally an alkali-soluble polymer also.

Examples of secondary polymeric binders include the following classes of polymers having an acidic group in (1) through (5) shown below on a main chain and/or side chain (pendant group).

(1) sulfone amide ($—SO_2NH—R$), (2) substituted sulfonamido based acid group (hereinafter, referred to as active imido group) [such as $—SO_2NHCOR$, $SO_2NHSO_2R$, $—CONHSO_2R$], (3) carboxylic acid group ($—CO_2H$), (4) sulfonic acid group ($—SO_3H$), and (5) phosphoric acid group ($—OPO_3H_2$).

R in the above-mentioned groups (1)-(5) represents hydrogen or a hydrocarbon group.

Representative secondary polymeric binders having the group (1) sulfone amide group are for instance, polymers that are constituted of a minimum constituent unit as a main component derived from a compound having a sulfone amide group. Thus, examples of such a compound include a compound having, in a molecule thereof, at least one sulfone amide group in which at least one hydrogen atom is bound to a nitrogen atom and at least one polymerizable unsaturated group. Among these compounds are m-aminosulfonylphenyl methacrylate, N-(p-aminosulfonylphenyl)methacrylamide, and N-(p-aminosulfonylphenyl)acrylamide. Thus, a homopolymer or a copolymer of polymerizing monomers having a sulfoneamide group such as m-aminosulfonylphenyl methacrylate, N-(p-aminosulfonylphenyl)methacrylamide, or N-(p-aminosulfonylphenyl)acrylamide can be used.

Examples of secondary polymeric binders with group (2) activated imido group are polymers comprising recurring units derived from compounds having activated imido group as the main constituent component. Examples of such compounds include polymerizable unsaturated compounds having a moiety defined by the following structural formula.

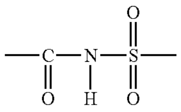

N-(p-toluenesulfonyl)methacrylamide and N-(p-toluenesulfonyl)acrylamide are examples of such polymerizable compounds.

Secondary polymeric binders having any of the groups (3) through (5) include those readily prepared by reacting ethylenically unsaturated polymerizable monomers having the desired acidic groups, or groups that can be converted to such acidic groups after polymerization.

Regarding the minimum constituent units having an acidic group that is selected from the (1) through (5), there is no need to use only one kind of acidic group in the polymer, and in some embodiments, it may be useful to have at least two kinds of acidic groups. Obviously, not every recurring unit in the secondary polymeric binder must have one of the acidic groups, but usually at least 10 mol % and typically at least 20 mol % comprise the recurring units having one of the noted acidic groups.

The secondary polymeric binder can have a weight average molecular weight of at least 2,000 and a number average molecular weight of at least 500. Typically, the weight average molecular weight is from about 5,000 to about 300,000, the number average molecular weight is from about 800 to about 250,000, and the degree of dispersion (weight average molecular weight/number average molecular weight) is from about 1.1 to about 10.

Mixtures of the secondary polymeric binders may be used with the one or more primary polymeric binders. The secondary polymeric binder(s) can be present in an amount of at least 1 weight % and up to 50 weight %, and typically from about 5 to about 30 weight %, based on the dry weight of the total polymeric binders in the radiation-sensitive composition or imageable layer.

The imageable elements further comprise a developability-enhancing compound that is an organic acid (particularly aromatic acid) that is substituted with one or more amino groups and one or more carboxylic acid (carboxy) group. Such groups can be connected through one or more aliphatic or aromatic groups. For example, the amino groups can be directly connected to alkylene, arylene, and cycloalkylene groups as defined in more detail below. In addition, the amino group can be part of an aromatic or non-aromatic heterocyclic N-containing ring. Up to 4 of each of the amino and carboxylic acid groups may be present in the developability-enhancing compound molecule, and particularly, at least one amino group can be present and directly attached to a substituted or unsubstituted aryl group (such as a substituted or unsubstituted phenyl group).

Representative developability-enhancing compounds can be defined by the following Structure (DEC):

$$[HO—C(=O)]_m\text{-}A\text{-}[N(R_1)(R_2)]_n \qquad \text{(DEC)}$$

In Structure DEC, $R_1$ and $R_2$ can be the same or different hydrogen or substituted or unsubstituted, linear or branched alkyl groups having 1 to 6 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl, and iso-hexyl groups), substituted or unsubstituted cycloalkyl groups having 5 to 10 carbon atoms in the hydrocarbon ring, or substituted or unsubstituted aryl groups having 6, 10, or 14 carbon atoms in the aromatic ring. In some embodiments, $R_1$ and $R_2$ can be the same or different substituted or unsubstituted aryl groups (such as phenyl or naphthyl groups), and it is particularly useful that at least one of $R_1$ and $R_2$ is a substituted or unsubstituted aryl group when A includes an alkylene group directly connected to $—[N(R_1)(R_2)]_n$.

In other embodiments, $R_1$ and $R_2$ can be the same or different hydrogen or substituted or unsubstituted, linear or branched alkyl groups having 1 to 6 carbon atoms (as noted above), substituted or unsubstituted cyclohexyl groups, or substituted or unsubstituted phenyl or naphthyl groups.

In Structure (DEC), A is a substituted or unsubstituted organic linking group having at least one carbon, nitrogen, sulfur, or oxygen atom in the chain, wherein A also comprises a substituted or unsubstituted arylene group (such as a substituted or unsubstituted phenylene group) directly connected to $—[N(R_1)(R_2)]_n$. Thus, A can include one or more arylene (for example, having 6 or 10 carbon atoms in the aromatic ring), cycloalkylene (for example, having 5 to 10 carbon atoms in the carbocyclic ring), alkylene (for example, having 1 to 12 carbon atoms in the chain, including linear and branched groups), oxy, thio, amido, carbonyl, carbonamido, sulfonamido, ethenylene (—CH=CH—), ethinylene (—C≡C—), or seleno groups, or any combination thereof. In some particularly useful embodiments, A consists of a substituted or unsubstituted arylene group (such as a substituted or unsubstituted phenylene group).

In Structure (DEC), m is an integer of 1 to 4 (typically 1 or 2) and n is an integer of 1 to 4 (typically 1 or 2), wherein m and n can be the same or different.

In still other embodiments, the developability-enhancing compound can be defined by the following Structure ($DEC_1$):

$$[HO—C(=O)]_m—B\text{-}A\text{-}[N(R_1)(R_2)]_n \qquad (DEC_1)$$

wherein $R_1$ and $R_2$ are as defined above, A is an organic linking group having a substituted or unsubstituted phenylene directly attached to $—[N(R_1)(R_2)]_n$, B is a single bond or an organic linking group having at least one carbon, oxygen, sulfur, or nitrogen atom in the chain, m is an integer of 1 or 2, n is an integer of 1 or 2. The "B" organic linking group can be defined the same as A is defined above except that it is not required that B contain an arylene group, and usually B, if present, is different than A.

The aryl (and arylene), cycloalkyl, and alkyl (and alkylene) groups described herein can have optionally up to 4 substituents including but not limited to, hydroxy, methoxy and other alkoxy groups, aryloxy groups such phenyloxy, thioaryloxy groups, halomethyl, trihalomethyl, halo, nitro, azo, thiohydroxy, thioalkoxy groups such as thiomethyl, cyano, amino, carboxy, ethenyl and other alkenyl groups, carboxyalkyl, aryl groups such as phenyl, alkyl groups, alkynyl, cycloalkyl, heteroaryl, and heteroalicyclic groups.

The imageable elements can include one or more aminobenzoic acids, dimethylaminobenzoic acids, aminosalicyclic acids, indole acetic acids, anilinodiacetic acids, N-phenyl glycine, or any combination thereof as developability-enhancing compounds. For example, such compounds can include but are not limited to, 4-aminobenzoic acid, 4-(N,N'-dimethylamino)benzoic acid, anilinodiacetic acid, N-phenyl glycine, 3-indoleacetic acid, and 4-aminosalicyclic acid.

The one or more developability enhancing compounds described above are generally present in an amount of from about 1 to about 30 weight %, or typically from about 2 to about 20 weight %.

In many embodiments, the radiation-sensitive composition and imageable element can have the polymeric binder(s) described above that are present at a coverage of from about 30 to about 95 weight %, one or more developability-enhancing compounds present at a coverage of from about 1 to about 30 weight %, and one or more radiation absorbing compounds that are infrared radiation absorbing compounds that are present at a coverage of from about 1 to about 25 weight %.

It is also possible to rise one or more of the developability-enhancing compounds of Structure (DEC) or ($DEC_1$) in combination with one or more acidic developability-enhancing compounds (ADEC), such as carboxylic acids or cyclic acid anhydrides, sulfonic acids, sulfinic acids, alkylsulfuric acids, phosphonic acids, phosphinic acids, phosphonic acid esters, phenols, sulfonamides, or sulfonimides since such a combination may permit further improved developing latitude and printing durability. Representative examples of such compounds are provided in [0030] to [0036] of U.S. Patent Application Publication 2005/0214677 (noted above) that is incorporated herein by reference with respect to these acid developability-enhancing compounds. Such compounds may be present in an amount of from about 0.1 to about 30 weight % based on the total dry weight of the radiation-sensitive composition or imageable layer.

In some instances, at least two of these acidic developability-enhancing compounds are used in combination with one or more (such as two) of the developability-enhancing compounds described above by Structure (DEC) or ($DEC_1$), In the combinations of the two types of developability-enhancing compounds described above, the molar ratio of one or more compounds represented by Structure (DEC) or ($DEC_1$) to one or more (ADEC) developability-enhancing compounds can be from about 0.1:1 to about 10:1 and more typically from about 0.5:1 to about 2:1.

Still again, the developability-enhancing compounds described by Structure (DEC) or ($DEC_1$) can be used in combination with basic developability-enhancing compounds as described in copending and commonly assigned U.S. Ser. No. 11/677,599 (filed Feb. 22, 2007 by Levanon, Postel, Rubin and Kurtser). Such compounds can be defined by the following Structure (BDEC):

$$(R^7)_s—N—[(CR^8R^9)_t—OH]_v \qquad \text{(BDEC)}$$

wherein t is 1 to 6, s is 0, 1, or 2, and v is 1 to 3, provided that the sum of s and v is 3. When s is 1, $R^7$ is hydrogen or an alkyl, alkylamine, cycloalkyl, heterocycloalkyl, aryl, arylamine, or heteroaryl group, and when s is 2, the multiple $R^7$ groups can be the same or different alkyl, alkylamine, cycloalkyl, heterocycloalkyl, aryl, arylamine, or heteroaryl groups, or the two $R^7$ groups together with the nitrogen atom, can form a substituted or unsubstituted heterocyclic ring. $R^8$ and $R^9$ are independently hydrogen or an alkyl group.

Examples of such organic BDEC compounds are N-(2-hydroxyethyl)-2-pyrrolidone, 1-(2-hydroxyethyl)piperazine, N-phenyldiethanolamine, triethanolamine, 2-[bis(2-hydroxyethyl)amino]-2-hydroxymethyl-1,3-propanediol, N,N,N',N'-tetrakis(2-hydroxyethyl)-ethylenediamine, N,N,N',N'-tetrakis(2-hydroxypropyl)-ethylenediamine, 3-[(2-hydroxyethyl)phenylamino]propionitrile, and hexahydro-1,3,5-tris(2-hydroxyethyl)-s-triazine. Mixtures of two or more of these compounds are also useful.

In the combination of the two types of developability-enhancing compounds described above, the molar ratio of one or more compounds represented by Structure (DEC) or ($DEC_1$) to one or more compounds enhancing compounds can be from about 0.1:1 to about 10:1 and more typically from about 0.5:1 to about 2:1.

Still again, the compounds described above by Structure (DEC) or ($DEC_1$) can be used in combination with one or more of the compounds identified above as ADEC compound, and with one or more of the compounds identified above by Structure (BDEC) in any suitable molar ratio.

The radiation-sensitive composition can include other optional addenda as described below for the imageable layer.

Imageable Elements

In general, the imageable elements are formed by suitable application of a formulation of the radiation-sensitive composition that contains one or more polymeric binders, the developability-enhancing compound(s), and typically a radiation absorbing compound (described below), as well as other optional addenda, to a suitable substrate to form an imageable layer. This substrate can be treated or coated in various ways as described below prior to application of the formulation. For example, the substrate can be treated to provide an "interlayer" for improved adhesion or hydrophilicity, and the imageable layer is applied over the interlayer.

The substrate generally has a hydrophilic surface, or a surface that is more hydrophilic than the applied imaging formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One substrate is composed of an aluminum support that may be coated or treated using techniques known in the art, including physical graining, electrochemical graining and chemical graining, followed by anodizing. The aluminum sheet can be mechanically or electrochemically grained and anodized using phosphoric acid or sulfuric acid and conventional procedures.

An optional interlayer may be formed by treatment of the aluminum support with, for example, a silicate, dextrine, calcium zirconium fluoride, hexafluorosilicic acid, phosphate/sodium fluoride, poly(vinyl phosphonic acid) (PVPA), vinyl phosphonic acid copolymer, poly(acrylic acid), or acrylic acid copolymer solution. The grained and anodized aluminum support can be treated with poly(acrylic acid) using known procedures to improve surface hydrophilicity.

The thickness of the substrate can be varied but should be sufficient to sustain the wear from printing and thin enough to wrap around a printing form. Some embodiments include a treated aluminum foil having a thickness of from about 100 μm to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaged cylinders is described for example in U.S. Pat. No. 5,713,287 (Gelbart).

The imageable layer typically comprises one or more radiation absorbing compounds. While these compounds can be sensitive to any suitable energy form (for example, UV, visible, and IR radiation) from about 150 to about 1500 nm, they are typically sensitive to infrared radiation and thus, the radiation absorbing compounds are known as infrared radiation absorbing compounds ("IR absorbing compounds") that generally absorb radiation from about 600 to about 1400 nm and more likely, from about 700 to about 1200 nm. The imageable layer is generally the outermost layer in the imageable element.

Examples of suitable IR dyes include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squarine dyes, oxazole dyes, croconine dyes, porphyrin dyes, and any substituted or ionic form of the preceding dye classes. Suitable dyes are described for example, in U.S. Pat. Nos. 4,973,572 (DeBoer), 5,208,135 (Patel et al.), 5,244,771 (Jandrue Sr. et al.), and 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, such as two sulfonic acid groups and two indolenine groups. Useful IR-sensitive cyanine dyes of this type are described for example in U.S. Patent Application Publication 2005-0130059 (Tao).

A general description of a useful class of suitable cyanine dyes is shown by the formula in [0026] of WO 2004/101280 (Munnelly et al.).

In addition to low molecular weight IR-absorbing dyes, IR dye moieties bonded to polymers can be used. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (Hauck et al.), 6,264,920 (Achilefu et al.), 6,153,356 (Urano et al.), 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds can also be pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET®200 or CAB-O-JET®300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer and typically the pigment particle size will be less than half the thickness of the imageable layer.

In the imageable elements, the radiation absorbing compound is generally present at a dry coverage of from about 0.1 to about 30 weight %, or typically from about 0.5 to about 20 weight %. The particular amount needed for this purpose would be readily apparent to one skilled in the art, depending upon the specific compound used.

Alternatively, the radiation absorbing compounds may be included in a separate layer that is in thermal contact with the single imageable layer. Thus, during imaging, the action of the radiation absorbing compound in the separate layer can be transferred to the imageable layer without the compound originally being incorporated into it.

The imageable layer (and radiation-sensitive composition) can also include one or more additional compounds that act as colorant dyes. Colorant dyes that are soluble in an alkaline developer are useful. Useful polar groups for colorant dyes include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetralkyl ammonium compounds and quaternized heterocyclic compounds such as quinolinium compounds, benzothiazolium compounds, pyridinium compounds, and imidazolium compounds. Useful colorant dyes include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France). These compounds can act as contrast dyes that distinguish the non-exposed (non-imaged) regions from the exposed (imaged) areas in the developed imageable element.

When a colorant dye is present in the imageable layer, its amount can vary widely, but generally it is present in an amount of from about 0.5 weight % to about 30 weight % (based on the total dry layer weight).

The imageable layer (and radiation-sensitive composition) can further include a variety of other additives including dispersing agents, humectants, biocides, plasticizers, non-ionic or amphoteric surfactants for coatability or other properties (such as fluoropolymers), wear-resistant polymers (such as polyurethanes, polyesters, epoxy resins, polyamides, and acrylic resins), viscosity builders, fillers and extenders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts (for example, as described in US Patent Application Publication 2005/0214677 of Nagashima).

The positive-working imageable element can be prepared by applying the imageable layer formulation over the surface of the substrate (and any other hydrophilic layers provided thereon) using conventional coating or lamination methods. Thus, the formulation can be applied by dispersing or dissolving the desired ingredients in a suitable coating solvent, and the resulting formulation is applied to the substrate using suitable equipment and procedures, such as spin coating, knife coating, gravure coating, die coating, slot coating, bar coating, wire rod coating, roller coating, or extrusion hopper coating. The formulation can also be applied by spraying onto a suitable support (such as an on-press printing cylinder).

The coating weight for the single imageable layer is from about 0.5 to about 2.5 g/m$^2$ or from about 1 to about 2 g/m$^2$.

The selection of solvents used to coat the layer formulation (s) depends upon the nature of the polymeric binders and other polymeric materials and non-polymeric components in the formulations. Generally, the imageable layer formulation is coated out of acetone, methyl ethyl ketone, or another ketone, tetrahydrofuran, 1-methoxy propan-2-ol (or 1-methoxy-2-propanol), N-methyl pyrrolidone, 1-methoxy-2-propyl acetate, γ-butyrolactone, and mixtures thereof using conditions and techniques well known in the art.

Alternatively, the layer(s) may be applied by conventional extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

After the imageable layer formulation is dried on the substrate (that is, the coating is self-supporting and dry to the touch), the element can be heat treated at from about 40 to about 90° C. (typically at from about 50 to about 70° C.) for at least 4 hours and typically at least 20 hours, or for at least 24 hours. The maximum heat treatment time can be as high as 96 hours, but the optimal time and temperature for the heat treatment can be readily determined by routine experimentation. Such heat treatments are described for example, in EP 823,327 (Nagasaka et al.) and EP 1,024,958 (McCullough et al.).

It may also be desirable that during the heat treatment, the imageable element is wrapped or encased in a water-impermeable sheet material to represent an effective barrier to moisture removal from the precursor. Further details of this conditioning process for individual, stacks, or coils of imageable elements are provided in U.S. Pat. No. 7,175,969 (Ray et al.).

Imaging and Development

The imageable elements of this invention can have any useful form including, but not limited to, printing plate precursors, printing cylinders, printing sleeves and printing tapes (including flexible printing webs). For example, the imageable members are lithographic printing plate precursors designed to form lithographic printing plates.

Printing plate precursors can be of any useful size and shape (for example, square or rectangular) having the requisite imageable layer disposed on a suitable substrate. Printing cylinders and sleeves are known as rotary printing members having the substrate and imageable layer in a cylindrical form. Hollow or solid metal cores can be used as substrates for printing sleeves.

During use, the imageable elements are exposed to a suitable source of radiation such as UV, visible light, or infrared radiation, depending upon the radiation absorbing compound present in the radiation-sensitive composition, at a wavelength of from about 150 to about 1500 nm. For most embodiments, imaging is carried out using an infrared or near-infrared laser at a wavelength of from about 700 to about 1200 nm. The laser used to expose the imaging member can be a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. A useful imaging apparatus is available as models of Kodak Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

IR imaging speeds may be from about 30 to about 1500 mJ/cm$^2$, or typically from about 40 to about 200 mJ/cm$^2$.

While laser imaging is usually practiced, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, as Fujitsu Thermal Head FTP-040 MCS001 and TDK Thermal Head F415 HH7-1089).

Imaging is generally carried out using direct digital imaging. The image signals are stored as a bitmap data file on a computer. Such data files may be generated by a raster image processor (RIP) or other suitable means. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable developer removes the exposed regions of the imageable layer and any layers underneath it, and exposing the hydrophilic surface of the substrate. Thus, such imageable elements are "positive-working" (for example, "positive-working" lithographic printing plate precursors).

Thus, development is carried out for a time sufficient to remove predominantly only the imaged (exposed) regions of the imageable layer, but as one skilled in the art would appreciate, not long enough to remove a significant amount of the non-imaged (non-exposed) regions of the imageable layer. The imaged (exposed) regions of the imageable layer are described as being "soluble" or "removable" in the developer because they are removed, dissolved, or dispersed within the developer more readily than the non-imaged (non-exposed) regions of the imageable layer. The term "soluble" also means "dispersible".

The imaged elements are generally developed using conventional processing conditions. Both aqueous alkaline developers and organic solvent-containing developers can be used. In most embodiments of the method of this invention, the higher pH aqueous alkaline developers are used.

Aqueous alkaline developers generally have a pH of at least 7 and typically of at least 11. Useful alkaline aqueous developers include 3000 Developer, 9000 Developer, GoldStar™ Developer, GoldStar™ Plus Developer, GoldStar™ Premium Developer, GREENSTAR Developer, ThermalPro Developer, PROTHERM Developer, MX1813 Developer, MX1710 Developer, and T-203.1 Developer (all available from Eastman Kodak Company, Norwalk, Conn.), Fuji HDP7 Developer (Fuji Photo) and Energy CTP Developer (Agfa). These compositions also generally include surfactants, chelating agents (such as salts of ethylenediaminetetraacetic acid), and alkaline components (such as inorganic metasilicates, organic metasilicates, hydroxides, and bicarbonates).

Organic solvent-containing developers are generally single-phase solutions of one or more organic solvents that are miscible with water. Useful organic solvents the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight. Such developers can be neutral, alkaline, or slightly acidic in pH. Most of these developers are alkaline in pH, for example up to pH 11.

Representative organic solvent-containing developers include ND-1 Developer, "2 in 1" Developer, 955 Developer, and 956 Developer (all available from Eastman Kodak Company, Norwalk, Conn.). HDN-1 Developer (available from Fuji), and EN 232 Developer (available from Agfa).

Generally, the developer is applied to the imaged element by rubbing or wiping it with an applicator containing the developer. Alternatively, the imaged element can be brushed with the developer or the developer may be applied by spraying the element with sufficient force to remove the exposed regions. Still again, the imaged element can be immersed in the developer. In all instances, a developed image is produced in a lithographic printing plate having excellent resistance to press room chemicals.

Following development, the imaged element can be rinsed with water and dried in a suitable fashion. The dried element can also be treated with a conventional gumming solution (preferably gum arabic).

The imaged and developed element can also be baked in a post-exposure bake operation that can be carried out to increase run length of the resulting imaged element. Baking can be carried out, for example at from about 220° C. to about 240° C. for from about 0.5 to about 10 minutes, or at about 120° C. for 30 minutes.

Printing can be carried out by applying a lithographic ink and fountain solution to the printing surface of the imaged element. The ink is taken up by the non-imaged (non-exposed or non-removed) regions of the imageable layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are presented as a means to illustrate the practice of this invention but the invention is not intended to be limited thereby.

EXAMPLES

The following components were used in the preparation and use of the examples. Unless otherwise indicated, the components are available from Aldrich Chemical Company (Milwaukee, Wis.):

ABA represents 4-aminobenzoic acid.

BF-03 represents a poly(vinyl alcohol), 98% hydrolyzed (Mw=15,000 ) that was obtained from Chang Chun Petrochemical Co. Ltd. (Taiwan).

BIS-TRIS represents 2,2-bis(hydroxymethyl)-2,2',2"-nitrilotriethanol.

Crystal Violet (C.I. 42555) is Basic Violet 3 or hexamethylpararosaniline chloride ($\lambda_{max}$=588 nm).

DMABA represents 4-(dimethylamino)benzoic acid.

DMSO represents dimethylsulfoxide.

GoldStar™ Premium Developer is a sodium silicate-containing alkaline developer that is available from Eastman Kodak Company (Norwalk, Conn.).

IAA represents 3-indoleacetaic acid.

LB 9900 is a resole resin that was obtained from Hexion Specialty Chemicals AG (Germany).

MEK represents methyl ethyl ketone.

MSA represents methanesulfonic acid (99%).

PASA represents 4-amino-2-hydroxybenzoic acid.

Polyfox® PF 652 is a surfactant that was obtained from Omnova (Fairlawn, Ohio).

PM represents 1-methoxy-2-propanol (also known as Dowanol® PM available from Dow Chemical or as Arcosolve® PM available from LyondellBissel Industries).

S 0094 is an IR dye ($\lambda_{max}$=813 nm) that was obtained from FEW Chemicals (Germany).

Sudan Black B is a neutral diazo dye (C.U. 26150) that is available from Acros Organics (Geel, Belgium).

TEA represents triethanolamine.

TETRAKIS represents N,N,N',N'-tetrakis(2-hydroxypropyl)-ethylenediamine that was obtained from Acros Organics.

THPE represents 1,1,1-tris(4-hydroxyphenyl)ethane.

Polymer A was prepared using the following procedure:

BF-03 (50 g) was added to reaction vessel fitted with a water-cooled condenser, a dropping funnel, and thermometer, and containing DMSO (200 g). With continual stirring, the mixture was heated for 30 minutes at 80° C. until it became a clear solution. The temperature was then adjusted at 60° C. and MSA (2.7 g) in DMSO (50 g) was added. Over 15 minutes, a solution of butyraldehyde (10.4 g) was added to the reaction mixture and it was kept for 1 hour at 55-60° C. 2-Hydroxybenzaldehyde (salicylic aldehyde, 39 g) in DMSO (100 g) was added to the reaction mixture. The reaction mixture was then diluted with anisole (350 g) and vacuum distillation was started. The anisole:water azeotrope was distilled out from the reaction mixture (less than 0.1% of water remained in the solution). The reaction mixture was chilled to room temperature and was neutralized with TEA (8 g) dissolved in DMSO (30 g), then blended with 6 kg of water. The resulting precipitated polymer was washed with water, filtered, and dried in vacuum for 24 hours at 50° C. to obtain 86 g of dry Polymer A.

Invention Examples 1-4 and Comparative Examples 1 & 2

Four imageable elements of the present invention and two Comparative Example elements outside of this invention were prepared in the following manner.

The Invention Examples 1-4 imageable element were prepared using the following radiation-sensitive composition having the following components:

Invention Examples 1-4

| | |
|---|---|
| Polymer A | 22.18 g |
| LB9900 (49% in PM) | 24.49 g |
| S 0094 IR Dye | 1.000 g |
| Crystal Violet | 0.800 g |
| Sudan Black | 0.800 g |
| Developability Enhancing Compound (TABLE I) | 3.100 g |
| PF 652 (10% in PM) | 1.150 g |
| PM | 273.0 g |
| MEK | 161.5 g |

The formulations were filtered and applied to an electrochemically roughened and anodized aluminum substrate that had been subjected to a treatment with an aqueous solution of sodium phosphate/sodium fluoride by means of common methods and the resulting imageable layer coating was dried for 1 minute at 100° C. in Glunz & Jensen "Unigraph Quartz" oven. The dry coverage of the imageable layer was about 1.5 g/m$^2$. The single imageable layer was the outermost layer of the imageable element.

The resulting imageable elements were exposed on a Kodak Lotem 400 Quantum imager in a range of energies of 40 mJ/cm$^2$ to 200 mJ/cm$^2$ and developed in a Mercury V6 processor using the GoldStar™ Premium Developer. The resulting printing plates were evaluated for sensitivity (clearing point: the lowest imaging energy at which the exposed regions were completely removed by the developer at a given temperature and time), Linearity Point (the energy at which the 50% dots at 200 lpi screen are reproduced as 50%±0.2% dots), and Cyan density loss in the non-exposed (non-imaged) regions that is a measure of coating weight loss in the non-exposed regions. The results are shown below in TABLE I.

A Comparative Example 1 imageable element was similarly prepared using the components of the following radiation-sensitive composition:

| | |
|---|---|
| Polymer A | 20.81 g |
| LB9900 (49% in PM) | 23.41 g |
| S 0094 IR Dye | 0.960 g |
| Crystal Violet | 0.770 g |
| Sudan Black | 0.770 g |
| BIS-TRIS | 2.300 g |
| TETRAKIS | 1.150 g |
| PF 652 (10% in PM) | 1.150 g |
| PM | 273.0 g |
| MEK | 154.5 g |

The evaluations of Comparative Example 1 are also shown below in TABLE I.

A Comparative Example 2 imageable element was similarly prepared using the components of the following radiation-sensitive composition:

| | |
|---|---|
| Polymer A | 20.81 g |
| LB9900 (49% in PM) | 23.41 g |
| S 0094 IR Dye | 0.960 g |
| Crystal Violet | 0.770 g |
| Sudan Black | 0.770 g |
| THPE | 3.450 g |
| PF 652 (10% in PM) | 1.150 g |
| PM | 273.0 g |
| MEK | 154.5 g |

The evaluations of Comparative Example 2 are also shown below in TABLE I.

TABLE I

| Imageable Element | Developability Enhancing Compound | Sensitivity (Clearing Point) mJ/cm$^2$ | Linearity Point (LP) mJ/cm$^2$ (23° C./30 sec.) | Cyan Density Loss (CDL) (%) (23° C./30 sec.) |
|---|---|---|---|---|
| Comparative Example 1 | Bis Tris/Tetrakis | 70 | 140 | 2.4 |
| Comparative Example 2 | THPE | 80 | 160 | 1.9 |
| Invention Example 1 | ABA | 50 | 110 | 1.8 |
| Invention Example 2 | DMABA | 50 | 125 | 2.4 |
| Invention Example 3* | PASA | 60* | 105* | 1.8* |
| Invention Example 4 | IAA | 80 | 150 | 2.4 |

*23° C./20 seconds

The results in TABLE I show that addition of a developability enhancing compound according to the present invention (Invention Examples 1-4) to a poly(vinyl acetal)-containing radiation-sensitive composition and imageable layer provided printing plate precursors (imageable elements) having high sensitivity when imaged using IR laser irradiation. Also, the LP data indicate that a printing plate of any of Invention Example 1, 2, 3, or 4 can perform the desired function at a low energy and therefore enabled a high throughput in the imaging device. In addition, when the elements of this invention were developed in an aqueous alkaline developer, low weight losses in the non-exposed regions were observed. The excellent performance of the printing plates prepared in Invention Examples 1-4 was achieved at lower concentration of the developability-enhancing compounds compared with the printing plates obtained with Comparative Examples 1 and 2.

The invention has been described in detail with particular reference to certain preferred embodiments thereof, but it will be understood that variations and modifications can be effected within the spirit and scope of the invention.

The invention claimed is:

1. A positive-working, infrared radiation-sensitive imageable element that is a lithographic printing plate precursor that comprises a substrate, and having thereon:

an imageable layer comprising an aqueous alkaline developer soluble polymeric binder, a developability-enhancing compound, and an infrared radiation absorbing compound, wherein said developability-enhancing compound is an organic compound having at least one amino group and at least one carboxylic acid group, wherein the at least one amino group is directly linked to an aryl group, wherein the aqueous alkaline developer soluble polymeric binder is a poly(vinyl acetal) that comprises at least 10 and up to 60 mol % of recurring units represented by the following Structure (PVAc), based on total recurring units:

(PVAc)

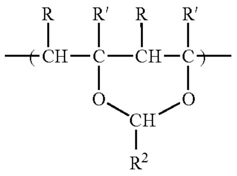

wherein R and R' are independently hydrogen or a substituted or unsubstituted alkyl, substituted or unsubstituted cycloalkyl, or halo group, and $R^2$ is a substituted or unsubstituted phenol, substituted or unsubstituted naphthol, or substituted or unsubstituted anthracenol group.

2. The element of claim 1 wherein said developability-enhancing compound is represented by the following Structure (DEC):

$$[HO—C(=O)]m—A—[N(R_1)(R_2)]_n \qquad \text{(DEC)}$$

wherein:

$R_1$ and $R_2$ are independently hydrogen or substituted or unsubstituted alkyl, substituted or unsubstituted cycloalkyl, or substituted or unsubstituted aryl groups, A is a substituted or unsubstituted organic linking group having at least one carbon, nitrogen, sulfur, or oxygen atom in the chain, wherein A also comprises a substituted or unsubstituted arylene group directly connected to —$[N(R_1)(R_2)]_n$, m is an integer of 1 to 4, and n is an integer of 1 to 4.

3. The element of claim 2 wherein A comprises a substituted or unsubstituted phenylene group directly attached to —$[N(R_1)(R_2)]_n$and m and n are independently 1 or 2.

4. The element of claim 1 comprising one or more aminobenzoic acids, dimethylaminobenzoic acids, aminosalicyclic acids, indole acetic acids, or anilinodiacetic acids, N-phenyl glycine, or any combination thereof as developability-enhancing compounds.

5. The element of claim 1 wherein said developability-enhancing compound is represented by the following Structure (DEC):

$$[HO—C(=O)]_m—A—[N(R1)(R_2)]_n \qquad \text{(DEC)}$$

wherein:

at least one of $R_1$ and $R_2$ is a substituted or unsubstituted aryl group, and the other is hydrogen or a substituted or unsubstituted alkyl, substituted or unsubstituted cycloalkyl, or substituted or unsubstituted aryl group, A is a substituted or unsubstituted organic linking group having at least one carbon, nitrogen, sulfur, or oxygen atom in the chain, wherein A also comprises a substituted or unsubstituted alkylene group directly connected to —$[N(R_1)(R_2)]_n$, m is an integer of 1 to 4, and n is an integer of 1 to 4.

6. The element of claim 1 wherein said polymeric binder is present at a coverage of from about 30 to about 95 weight %, said developability-enhancing composition is present at a coverage of from about 1 to about 30 weight %, and said infrared radiation absorbing compound is present at a coverage of from about 1 to about 25 weight %, all based on the total dry weight of a single imageable layer that is the outermost layer in said imageable element.

7. The element of claim 1 wherein said polymeric binder comprises a poly(vinyl acetal) comprising recurring units represented by Structure (Ia):

(Ia)

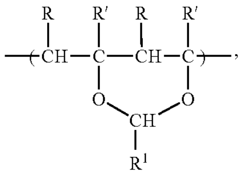

Structure (Ib):

(Ib)

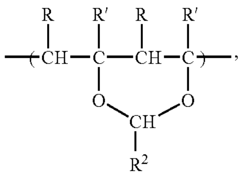

Structure (Ic):

(Ic)

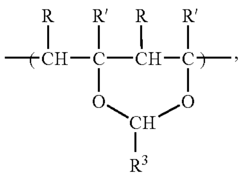

Structure (Id):

(Id)

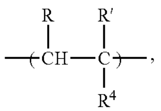

and

Structure (Ie):

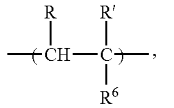
(Ie)

wherein the Structure (Ia) recurring units are present at from about 5 to about 40 mol %, the Structure (Ib) recurring units are present at from about 10 to about 60 mol %, the Structure (Ic) recurring units are present at from 0 to about 20 mol %, the Structure (Id) recurring units are present at from about 1 to about 20 mol %, and the Structure (Ie) recurring units are present at from about 5 to about 49 mol %, provided that the total of Structure (Ia), Structure (Ib), and Structure (Ic) recurring units is at least 50 mol %, R and R' are independently hydrogen or a substituted or unsubstituted alkyl, substituted or unsubstituted cycloalkyl, or halo group, $R^1$ is a substituted or unsubstituted alkyl, substituted or unsubstituted cycloalkyl, or substituted or unsubstituted aryl group other than a substituted or unsubstituted phenol or naphthol group, $R^2$ is a substituted or unsubstituted phenol, substituted or unsubstituted naphthol, or substituted or unsubstituted anthracenol group, $R^3$ is a substituted or unsubstituted alkenyl or phenyl group, $R^4$ is an —O—C(═O)—$R^5$ group wherein $R^5$ is a substituted or unsubstituted alkyl or substituted or unsubstituted aryl group, and $R^6$ is a hydroxy group.

8. A method of making an image comprising:

A) imagewise exposing the positive-working imageable element of claim 1 to provide exposed and non-exposed regions, and B) developing said imagewise exposed element to remove predominantly only said exposed regions to provide an image in said imaged and developed element.

9. The method of claim 8 wherein said imageable element contains an infrared radiation absorbing dye and is imagewise exposed at a wavelength of from about 700 to about 1200 nm.

10. The method of claim 8 wherein said imageable element comprises a developability-enhancing compound is represented by the following Structure (DEC):

$$[HO—C(═O)]_m\text{-}A\text{-}[N(R_1)(R_2)]_n \quad \text{(DEC)}$$

wherein:

$R_1$ and $R_2$ are independently hydrogen or substituted or unsubstituted alkyl, substituted or unsubstituted cycloalkyl, or substituted or unsubstituted aryl groups, A is a substituted or unsubstituted organic linking group having at least one carbon, nitrogen, sulfur, or oxygen atom in the chain, wherein A also comprises a substituted or unsubstituted phenylene group directly connected to —$[N(R_1)(R_2)]_n$, m is an integer of 1 or 2, and n is an integer of 1 or 2.

11. The method of claim 8 wherein said imageable element comprises one or more aminobenzoic acids, dimethylaminobenzoic acids, aminosalicyclic acids, indole acetic acids, N-phenyl glycine, or anilinodiacetic acids.

12. A positive-working, infrared radiation-sensitive imageable element that is a lithographic printing plate precursor comprising an aluminum-containing substrate, and having thereon:

an outermost single imageable layer comprising an aqueous alkaline developer soluble polymeric binder, a developability-enhancing compound, and an infrared radiation absorbing dye, wherein said developability-enhancing compound is represented by the following Structure ($DEC_1$):

$$[HO—C(═O)]_m—B\text{-}A\text{-}[N(R_1)(R_2)]_n \quad (DEC_1)$$

wherein:

$R_1$ and $R_2$ are independently hydrogen or substituted or unsubstituted alkyl, substituted or unsubstituted cycloalkyl, or substituted or unsubstituted aryl groups, A is an organic linking group having a substituted or unsubstituted phenylene directly attached to —$[N(R_1)(R_2)]_n$, B is a single bond or an organic linking group having at least one carbon, oxygen, sulfur, or nitrogen atom in the chain, m is an integer of 1 or 2, n is an integer of 1 or 2, said polymeric binder comprises a poly(vinyl acetal) that comprises at least 10 and up to 60 mol% of recurring units represented by the following Structure (PVAc), based on total recurring units:

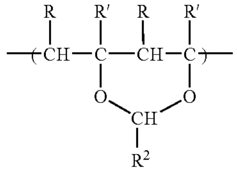
(PVAc)

wherein R and R' are independently hydrogen or a substituted or unsubstituted alkyl, substituted or unsubstituted cycloalkyl, or halo group, and $R^2$ is a substituted or unsubstituted phenol, substituted or unsubstituted naphthol, or substituted or unsubstituted anthracenol group.

13. The element of claim 12 wherein said poly(vinyl acetal) comprises recurring units represented by Structure (Ia):

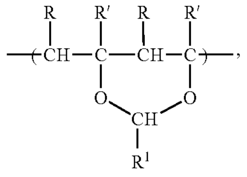
(Ia)

Structure (Ib):

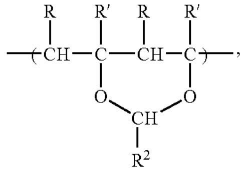
(Ib)

Structure (Ic):

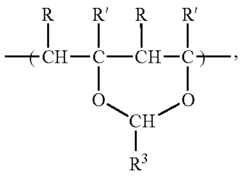

(Ic)

Structure (Id):

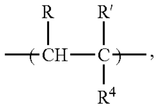

(Id)

and

Structure (Ie):

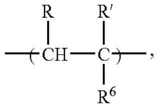

(Ie)

wherein the Structure (Ia) recurring units are from about 5 to about 40 mol %, the Structure (Ib) recurring units are from about 10 to about 60 mol %, the Structure (Ic) recurring units are from 0 to about 20 mol %, the Structure (Id) recurring units are from about 1 to about 20 mol %, and the Structure (Ie) recurring units are from about 5 to about 49 mol %, provided that the total Structure (Ia), (Ib), and (Ic) recurring units is at least 50 mol %, R and R' are independently hydrogen or a substituted or unsubstituted alkyl, substituted or unsubstituted cycloalkyl, or halo group, $R^1$ is a substituted or unsubstituted alkyl, substituted or unsubstituted cycloalkyl, or substituted or unsubstituted aryl group other than a substituted or unsubstituted phenol or naphthol group, $R^2$ is a substituted or unsubstituted phenol, substituted or unsubstituted naphthol, or substituted or unsubstituted anthracenol group, $R^3$ is a substituted or unsubstituted alkenyl or phenyl group, $R^4$ is an —O—C(=O)—$R^5$ group wherein $R^5$ is a substituted or unsubstituted alkyl or substituted or unsubstituted aryl group, and $R^6$ is a hydroxy group.

14. The element of claim 12 comprising one or more of 4-aminobenzoic acid, 4-(N,N'-dimethylamino)benzoic acid, anilinodiacetic acid, N-phenyl glycine, 3-indoleacetic acid, and 4-aminosalicyclic acid.

* * * * *

UNITED STATES PATENT AND TRADEMARK OFFICE

CERTIFICATE OF CORRECTION

PATENT NO. : 8,088,549 B2
APPLICATION NO. : 11/959492
DATED : January 3, 2012
INVENTOR(S) : Levanon et al.

It is certified that error appears in the above-identified patent and that said Letters Patent is hereby corrected as shown below:

Title Page, Item (75), delete “Hashron” and insert -- Hasharon --.

In the Specifications

In Column 27, line 51, delete “ $[HO\ C(=O)]_m\ A\ [N(R_1)(R_2)]_n$ ” and insert -- $[HO\text{-}C(=O)]_m\text{-}A\text{-}[N(R_1)(R_2)]_n$ --.

In Column 28, line 7, delete “ $[HO\ C(=O)]_m\ A\ [N(R_1)(R_2)]_n$ ” and insert

-- $[HO\text{-}C(=O)]_m\text{-}A\text{-}[N(R_1)(R_2)]_n$--.

Signed and Sealed this
Sixteenth Day of April, 2013

Teresa Stanek Rea
*Acting Director of the United States Patent and Trademark Office*